(12) United States Patent
Yeh et al.

(10) Patent No.: US 8,555,591 B2
(45) Date of Patent: Oct. 15, 2013

(54) OUTDOOR ENCLOSURE LOUVER SYSTEM

(75) Inventors: Joseph Yeh, Plano, TX (US); Walter Hendrix, Richardson, TX (US); Michael Paulus, Dallas, TX (US); Gabriel Martinez, Grand Prairie, TX (US); Wesley Allen Christensen, Fremont, NE (US); Paul Brush, Saylorsburg, PA (US)

(73) Assignee: CommScope, Inc. of North Carolina, Hickory, NC (US)

(*) Notice: Subject to any disclaimer, the term of this patent is extended or adjusted under 35 U.S.C. 154(b) by 370 days.

(21) Appl. No.: 12/388,626

(22) Filed: Feb. 19, 2009

(65) Prior Publication Data

US 2009/0241454 A1    Oct. 1, 2009

Related U.S. Application Data

(60) Provisional application No. 61/041,560, filed on Apr. 1, 2008.

(51) Int. Cl.
 *E06B 7/08* (2006.01)
(52) U.S. Cl.
 USPC .......... 52/473; 52/213; 52/656.7; 52/656.8; 49/74.1; 454/277
(58) Field of Classification Search
 USPC ............. 52/473, 656.7, 656.4, 656.8, 656.9, 52/666, 665, 213; 49/74.1; 454/309, 277
 See application file for complete search history.

(56) References Cited

U.S. PATENT DOCUMENTS

| | | | | |
|---|---|---|---|---|
| 3,968,738 | A * | 7/1976 | Matzke | 454/309 |
| 5,217,513 | A | 6/1993 | Armbruster | |
| 5,255,486 | A | 10/1993 | Wang | |
| 5,755,069 | A * | 5/1998 | Sullivan | 52/473 |
| 5,778,598 | A * | 7/1998 | Ohanesian | 49/74.1 |
| 5,987,836 | A * | 11/1999 | Sullivan | 52/473 |
| 6,126,708 | A * | 10/2000 | Mack et al. | 55/502 |
| 6,205,713 | B1 * | 3/2001 | Thompson et al. | 49/465 |
| 6,219,985 | B1 * | 4/2001 | Hsu | 52/473 |
| 6,266,923 | B1 * | 7/2001 | Lee | 49/87.1 |
| 6,560,941 | B1 * | 5/2003 | French | 52/473 |
| 6,810,620 | B1 * | 11/2004 | Anderson et al. | 49/74.1 |
| 7,036,279 | B2 * | 5/2006 | Crozzoli | 52/213 |
| 7,131,241 | B2 * | 11/2006 | Blackwell et al. | 52/473 |
| 7,258,607 | B1 * | 8/2007 | Machiorlette et al. | 454/276 |
| 7,353,636 | B1 * | 4/2008 | Anderson et al. | 49/82.1 |
| 7,677,003 | B2 * | 3/2010 | Baughn et al. | 52/473 |
| 2004/0134444 | A1 | 7/2004 | Shiever et al. | |

FOREIGN PATENT DOCUMENTS

KR    10-00767069    10/2007

* cited by examiner

*Primary Examiner* — Chi Q Nguyen
(74) *Attorney, Agent, or Firm* — Muncy, Geissler, Olds & Lowe, PLLC

(57) ABSTRACT

A louvered door assembly for an outdoor electronic enclosure includes an outer panel attached to an inner panel. Channels for holding louvers are attached to both panels. Each channel has slots formed therein which receive the individual louvers and hold them in position without fasteners. The inner panel holds the louvers in the slots. The louvered door assembly provides a clean look, a compact arrangement, large air flow and resists water ingress into the enclosure.

20 Claims, 4 Drawing Sheets

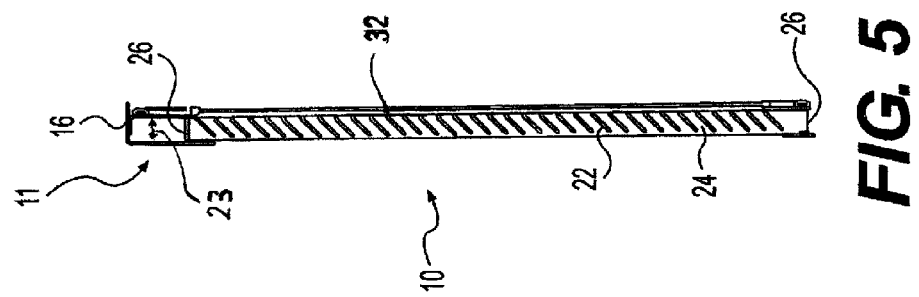
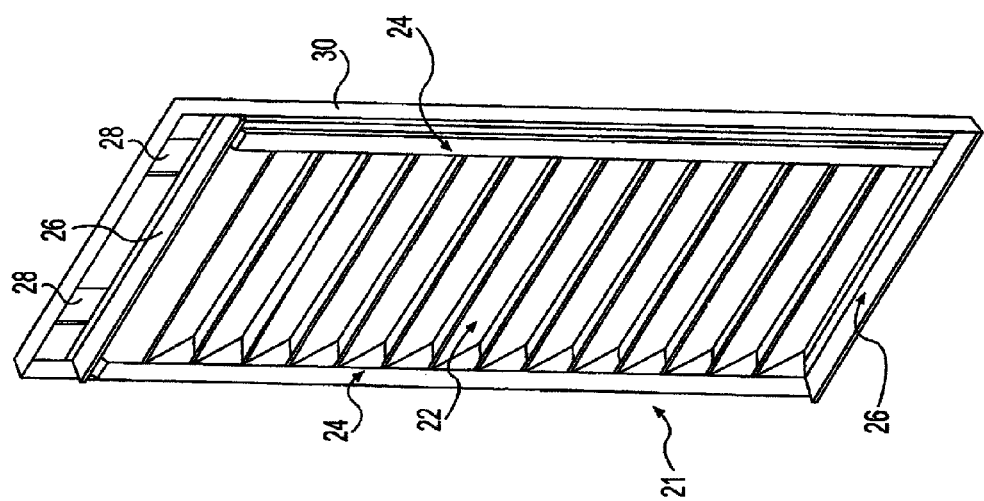

OUTDOOR ENCLOSURE LOUVER SYSTEM

CROSS REFERENCE TO RELATED APPLICATION

The present invention claims the benefit of U.S. provisional patent application No. 61/041,560, filed Apr. 1, 2008, the entire contents of which is hereby incorporated by reference.

FIELD OF THE INVENTION

The present invention is directed toward a louver system for an outdoor electronics enclosure and more specifically, toward a louver door for an outdoor electronics enclosure having slots for receiving the individual louvers.

BACKGROUND OF THE INVENTION

Outdoor enclosures for telecommunications equipment and other electronics are well known. These cabinets must control the temperature of the equipment they contain within specified temperature levels. For enclosures housing equipment with extremely high heat dissipation, the only method that provides sufficient heat transfer is direct air cooling. To ensure the necessary airflow, openings or louvers must be placed in the enclosure to allow air to enter and exit.

While many such enclosures are available, it is desirable to provide devices which are aesthetically pleasing, provide large cross-sectional areas for air intake, are compact, mitigate the impact of solar heating, reduce acoustic emission, prevent moisture ingress and are scalable to different sizes. Further, simplicity of manufacture is desirable to decrease costs.

SUMMARY OF THE INVENTION

The present invention addresses one or more of these needs by providing a louvered door system having an outer panel, an inner panel, and central louver retaining channels. The channels have slots for holding the louvers. The slots are open at one end so that the louvers can be easily inserted. The inner panel holds the louvers in place so that mechanical fasteners such as rivets, screws, etc. are unnecessary.

The outer panel provides a flush face with the enclosure to make the device more attractive. The louvered open area is large to increase the air intake. The overall size is reduced and yet remains scalable for different sized enclosures.

Another aspect of the invention is that the overlapping louvers provide protection from moisture ingress and further safety protection for personnel and equipment.

BRIEF DESCRIPTION OF THE DRAWINGS

These other aspects and features of embodiments of the present invention will be better understood after reading the following detailed description, together with the attached drawings, wherein:

FIG. 4 is a perspective view of the inner cover and channel for holding the louvers;

FIG. 5 is a cross-section view of the louvered door of the present invention;

DETAILED DESCRIPTION

Figure 1:
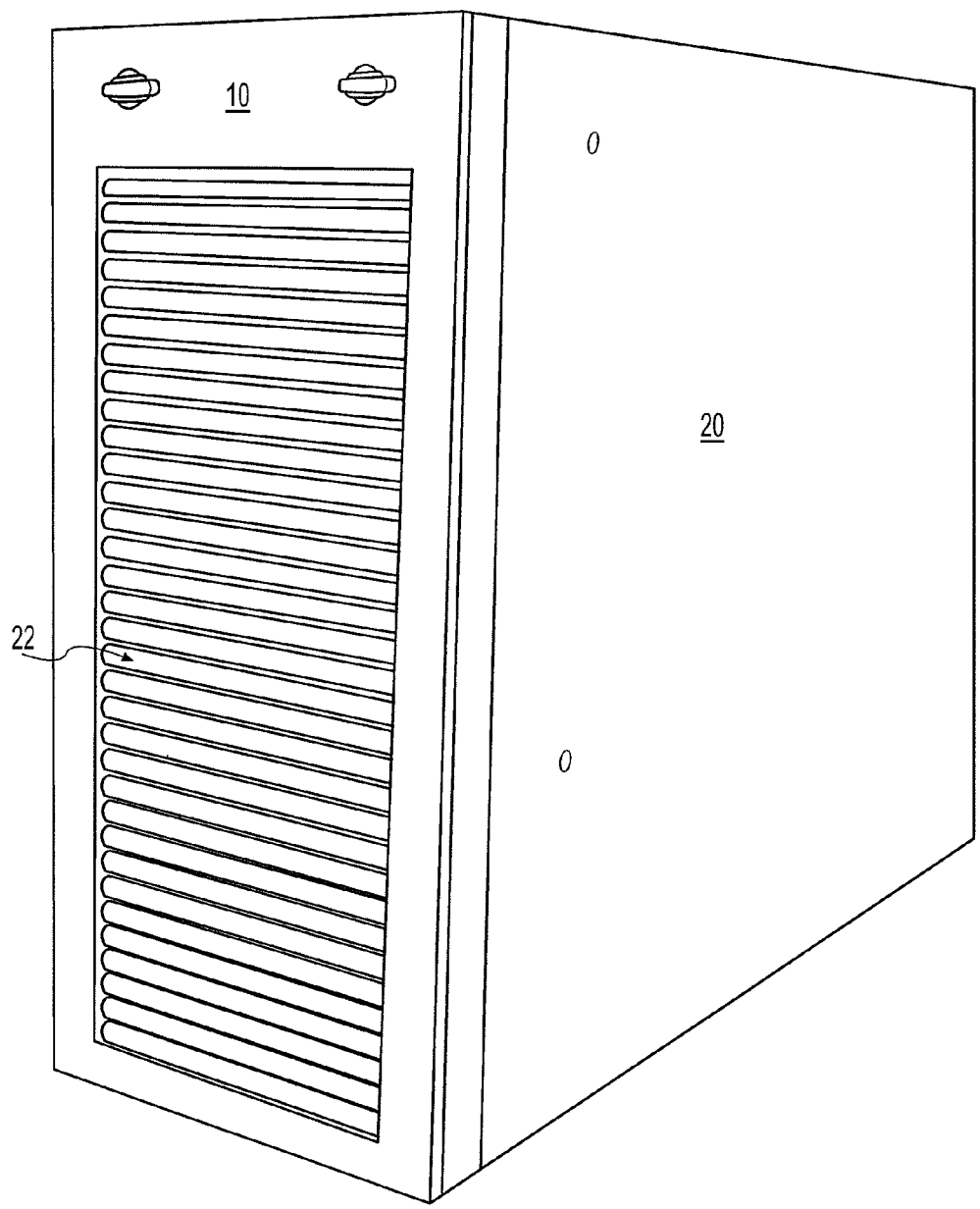
FIG. 1 is a perspective view of an outdoor enclosure having the louvered door of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Referring now to the drawings, FIG. 1 illustrates an enclosure 20 for housing telecommunications and other electronics in an outdoor setting. The enclosure 20 includes a louvered door assembly 10 mounted on the front of the enclosure 20. The louvered door assembly 10 may be removed for access to the inside of the enclosure 20. Louvers 22 are present in the center of the louvered door assembly 10 to allow air to enter and exit the enclosure 20.

Figure 2:
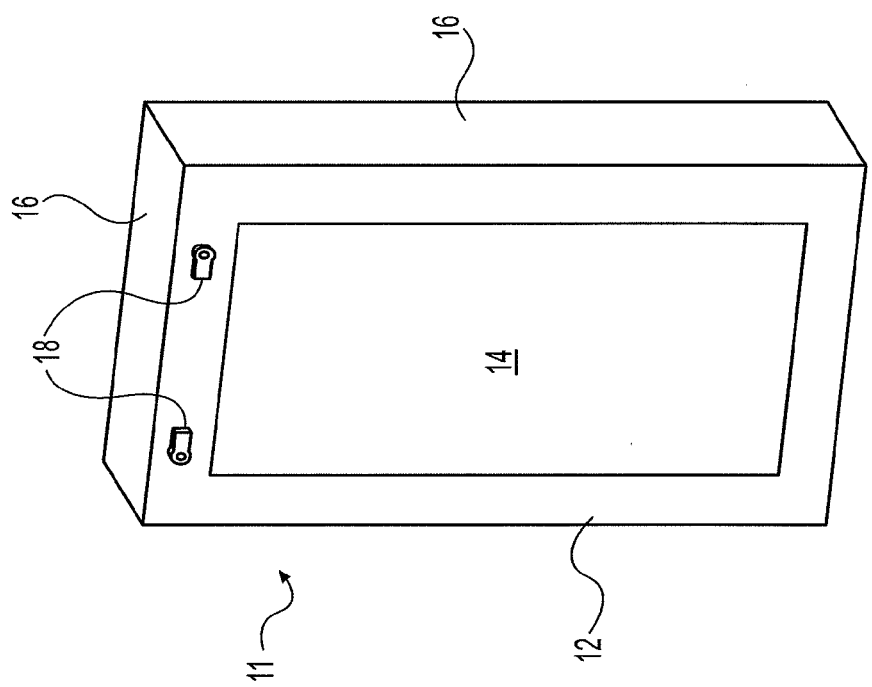
FIG. 2 is a perspective view of the outer cover of the present invention.

FIG. 2 shows an outer panel 11 of the louvered door assembly 10. The outer panel 11 includes a front face 12 having a central opening 14 which forms an entrance area for the air. At each edge of the front face 12, a flange 16 is formed to provide a side for the outer panel 11. This flange 16 may be formed from the same metal piece as the front face 12 merely by bending the metal along an appropriate line. Latches 18 are included on the upper portion of the front face 12 to hold the louvered door assembly 10 onto the enclosure 20. Aside from the latches 18, the front face 12 has no other projections, leading to a more attractive flat surface. The side flanges 16 may also be made flush with the sides of the enclosure 20 in order to improve the appearance of the enclosure 20.

Figure 3:
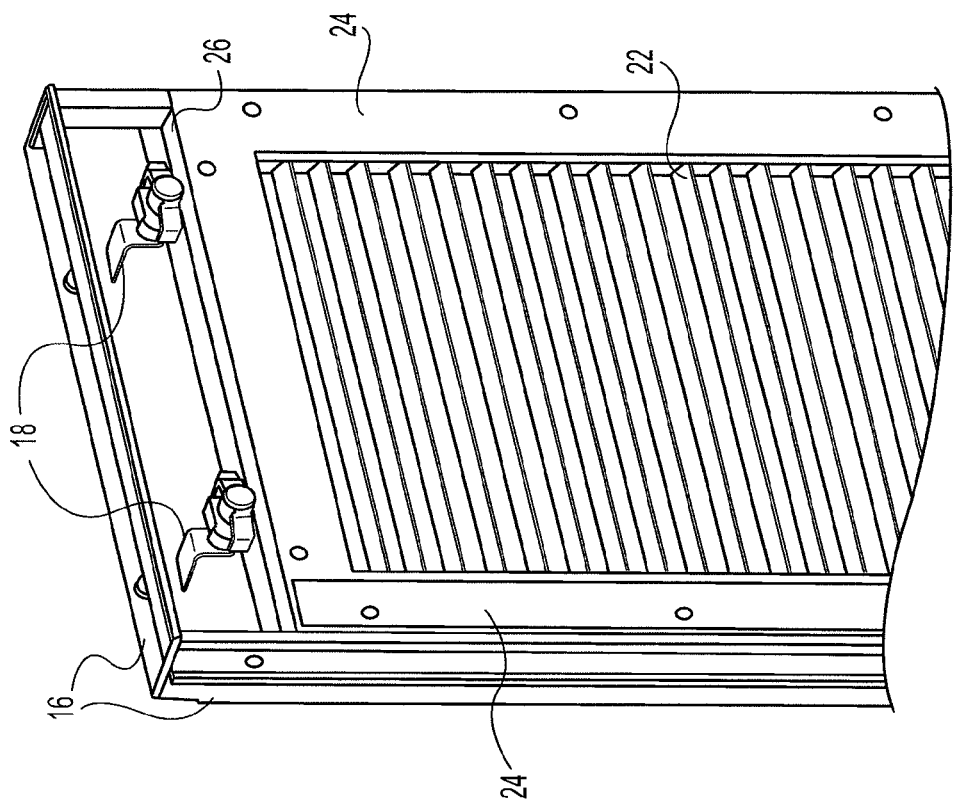
FIG. 3 is a perspective view from the rear of the outer cover and channel for holding the louvers.

FIG. 3 shows the louvered door assembly 10 from the rear in a partially assembled condition. The flanges 16 are seen as enclosing channels 24 for holding the louvers 22. Closeout channels 26 are also provided above and below the louvered area to prevent air from leaking around the louvers 22 so that air movement is limited to the area of the louvers 22. The backside of the latches 18 are also seen near the top of the louvered door assembly 10.

FIG. 4 shows an inner panel 21 of the louvered door assembly 10 from the front in a partially assembled condition. The inner panel 21 is shown as having flanges 30 along its edges into which the channels 24 are received. Closeout channels 26 are also provided at the top and bottom area. The louvers 22 are seen extending from one of the channels 24 to the other.

FIG. 5 is a cross-sectional view of the louvered door assembly 10. The outer panel 11 and the inner panel 21 extend around the channel 24 which holds louvers 22. An air gap 23 is formed between the two panels in areas not covered by the louvers 22.

Figure 6:
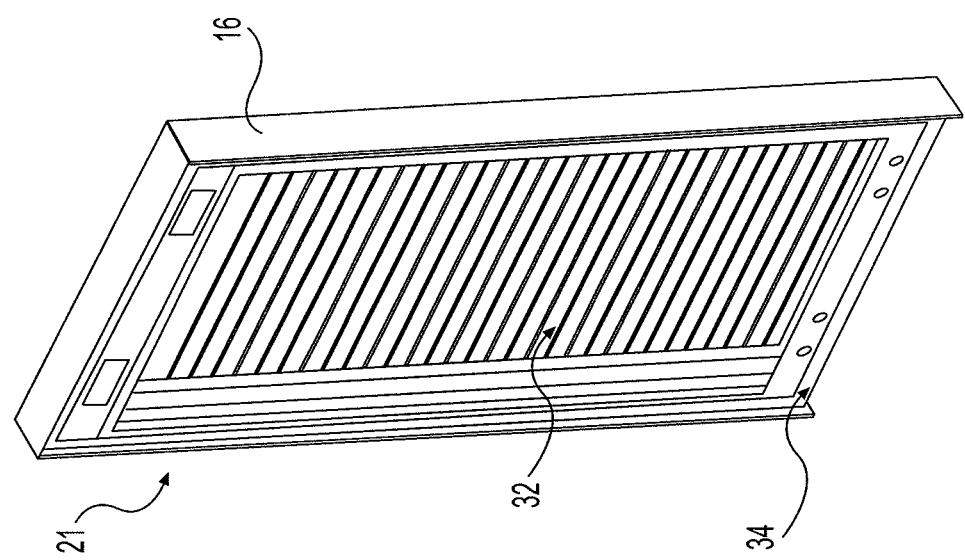
FIG. 6 is a perspective view of the door assembly of the present invention.

FIG. 6 is a perspective view showing the inner panel 21 side of the louvered door assembly 10. As can be seen, the flanges 16 from the outer panel 11 extend backwardly to enclose both the channels 24 and the inner panel 21. A metal filter 32 may be placed behind the louvers 22 and in front of the inner panel 21. This helps to prevent the ingress of water and other material into the enclosure 20 from outside. A gasket 34 is placed around the periphery of the inside of flanges 16 so as to form a tight seal with the side edges of the enclosure 20. This also prevents air from entering the enclosure 20 without passing through the louvers 22.

Figure 7:
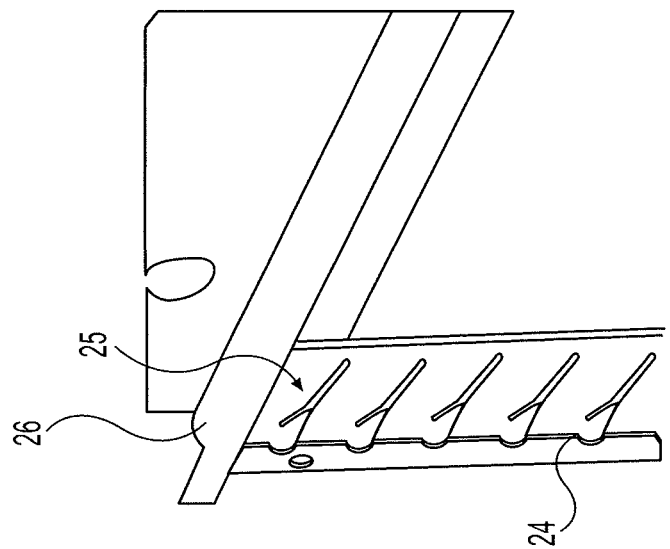
FIG. 7 is a side view of the channel for holding the louvers.

FIG. 7 shows a closer view of one of the channels 24 which hold the louvers 22. The channel 24 has a flat surface into which is punched or cut a series of parallel slots 25. The lower end of each slot 25 is closed, but the upper end is open. The slots 25 extend at an angle so that when the louvers 22 are inserted, they overlap, e.g., as viewed from a direction perpendicular to the front face 12 of the outer panel 11. In fact, one can not see through the gaps between the louvers 22, even at a slight plus or minus angle from the perpendicular direction because of the louver depth.

In assembling the louvered door assembly 10, the channels 24 are connected to the outer panel 11 using rivets or other means. The individual louvers 22 are then placed into the slots 25 from the upper open end. The inner panel 21 is then connected to the channels 24 so as to close the slots 25. Thus, the louvers 22 are prevented from leaving the slots 25 by the presence of the inner panel 21. This arrangement avoids the need for individually connecting the louvers 22 using rivets or other means. Accordingly, assembly of the louvers 22 is made simpler and cheaper.

The present arrangement of the louvers 22 provides a wide area of air inlet. The louvers 22 extend across the entire width of the central opening 14. This differs from prior art devices which typically use stamped louvers which are relatively narrow in depth. When louvers are stamped out, as in the prior art, the louvers do not overlap as viewed from a direction perpendicular to the front face of the outer door. Rather, a direct line of sight exists through the gaps between the louvers, as viewed at the perpendicular to the front face of the outer door. Such an arrangement does not resist the ingress of water into an enclosure as well as the present invention, especially wind driven rain. In addition, the vertical distance between louvers may be larger, such as 0.5 inch. This also allows additional air to flow through the louvers.

This arrangement of louvers 22 also allows for scalability of this arrangement. Thus, louvered door assemblies 10 having the same width of the central opening 14 but a different length may be made with the same channels 24, but merely shortened or lengthened. If desired, the assembly may be made wider and similar parts can still be used, with the channels 24 being used without change and the louvers 22 being made longer. It is also possible to use two louvered areas side-by-side depending on the size of the enclosure 20. Thus, this arrangement is completely scalable which allows for easy manufacture of varying sized enclosures 20.

It should also be noted that the louvers 22 do not extend forward from the outer panel 11, but are recessed within the opening 14. This makes the details of the enclosure 20 less obtrusive and more aesthetically pleasing. Only the latches 18 extend outside the outer panel 11, which simplifies the appearance of the enclosure 20.

The overall thickness of the louvered door assembly 10 is minimized by having an overlapping louver 22 arrangement as compared to punched louvers in the prior art. The integration of the channels 24, the outside panel 11 and inner panel 21 also decreases the overall size of the louvered door assembly 10. The overlapping louvers 22 provide a maximum air opening while reducing the possibility of moisture ingress or accidental entry of a person or tool into the enclosure 20.

Since the enclosures 20 are often located in an area receiving sunlight, the enclosure 20 can be subject to solar heating where the light shines on the enclosure's wall(s). The louvered door assembly 10 helps avoid this problem by providing an air gap between the outer panel 11 and inner panel 21. This air gap acts as insulation against the heat generated on the outer panel 11 by the sunlight. Similarly, acoustic noise from any fans or electronics inside the enclosure 20 may be reduced due to this dual wall construction.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

The invention claimed is:

1. A louvered door assembly, comprising:
a front panel having an opening;
flanges attached to said front panel extending away from said front panel;
a rear panel;
a pair of louver retaining channels, located between said flanges, each channel having a series of slots; and
a plurality of louvers, with one louver located in each of said series of slots,
wherein said channels and said louvers are located between said front panel on a front side and said rear panel on a rear side, with said louvers being in line with said opening of said front panel,
wherein a gap is formed at peripheral portions around said opening between said front panel and said rear panel to reduce noise emission and insulate heat passage from solar heating,
wherein said slots extend at an angle relative to said louver retaining channels, each slot having a closed lower end and an open upper end; and
wherein said louvers are held in said slots by said rear panel closing off said open upper ends of said slots.

2. The louvered door assembly according to claim 1, wherein said flanges attached to said front panel extend in a perpendicular direction to a front face of said front panel.

3. The louvered door assembly according to claim 1, further comprising closeout channels located at tops and bottoms of said louver retaining channels and extending therebetween to limit air movement to an area of said louvers.

4. The louvered door assembly according to claim 1, further comprising latches extending outwardly from said front panel, with no other part of said louvered door assembly extending outwardly from said front panel.

5. The louvered door assembly according to claim 1, wherein said louvers are overlapping, as viewed from a direction perpendicular to a front face of said front panel.

6. The louvered door assembly according to claim 1, wherein said channels are attached to said front panel.

7. The louvered panel assembly according to claim 1, wherein said louvers extend across a width of said opening.

8. The louvered door assembly according to claim 1, further comprising a filter mounted between said louvers and said rear panel to prevent ingress of moisture and other debris.

9. The louvered door assembly according to claim 1, wherein said flanges extend away from outer peripheral edges of said front panel to form sides of said louvered door.

10. The louvered door assembly according to claim 1, wherein said gap includes air.

11. An outdoor enclosure for electronics, comprising:
a housing, having an opening in at least one end;
a louvered door mounted on said housing to close said opening; and
sides of said louvered door being flush with sides of said housing;
wherein said louvered door includes:
a front panel having an opening;
flanges at outer peripheral edges of said front panel extending away from a front face of said front panel to form said sides of said louvered door being flush with sides of said housing;
a rear panel;
a pair of louver retaining channels, located between said flanges, each channel having a series of slots; and
a plurality of louvers, with one louver located in each of said series of slots,
wherein said channels and said louvers are located between said front panel on a front side and said rear panel on a rear side, with said louvers being in line with said opening of said front panel, and wherein a gap is formed at peripheral portions around said opening between said front panel and said rear panel to reduce noise emission and insulate heat passage from solar heating.

12. The outdoor enclosure according to claim 11, further comprising a gasket mounted around a rear edge of said louvered door for interacting with a front edge of said housing to seal said louvered door to said housing.

13. The outdoor enclosure according to claim 11, wherein said slots extend at an angle relative to said louver retaining channels, each slot having a closed lower end and an open upper end.

14. The outdoor enclosure according to claim 13, wherein said louvers are held in said slots by said rear panel closing off said open upper ends of said slots.

15. The outdoor enclosure according to claim 11, wherein said louvers are overlapped, as viewed from a direction perpendicular to a front face of said louvered door.

16. The outdoor enclosure according to claim 11, wherein said flanges are formed as a same metal piece with said front panel, and are defined as a bent portions extending away from said front panel.

17. The outdoor enclosure according to claim 11, further comprising:
latches mounted on a front face of said louvered door for holding said door to said housing.

18. A method of making a louvered door, comprising:
forming slots in a pair of louver retaining channels, the slots having a lower closed end and an open upper end, the slots extending at an angle relative to the louver retaining channels;
attaching the louver retaining channels to a front panel with an opening, said front panel having flanges attached thereto extending away from a front face of said front panel to form side edges to which the louver retaining channels are attached;
placing louvers in the slots through the open upper end, with one louver in each slot, wherein the louvers are in line with said opening of said front panel; and
attaching a rear panel to the front panel, said rear panel holding said louvers in place by closing off said open upper ends of said slots, wherein a gap is formed at peripheral portions around said opening between said front panel and said rear panel to reduce noise emission and insulate heat passage from solar heating.

19. The method of claim 18, further comprising:
attaching a first closeout channel between tops of the louver retaining channels; and
attaching a second closeout channel between bottoms of the louver retaining channels.

20. The method of claim 18, wherein the louvers are overlapped, as viewed from a direction perpendicular to a front face of the front panel.

* * * * *